US012687596B2

(12) United States Patent
Leussler et al.

(10) Patent No.: US 12,687,596 B2
(45) Date of Patent: Jul. 21, 2026

(54) FLEXIBLE MAGNETIC RESONANCE (MR) COIL ARRAY USING ELECTRICAL ZIPPER CONTACTS

(71) Applicant: KONINKLIJKE PHILIPS N.V., Eindhoven (NL)

(72) Inventors: Christoph Günther Leussler, Hamburg (DE); Oliver Lips, Hamburg (DE); Peter Vernickel, Hamburg (DE); Peter Caesar Mazurkewitz, Hamburg (DE); Christian Findeklee, Norderstedt (DE); Josef Scholz, Halstenbek (DE); Ingo Schmale, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 157 days.

(21) Appl. No.: 18/694,442

(22) PCT Filed: Aug. 29, 2022

(86) PCT No.: PCT/EP2022/073932
§ 371 (c)(1),
(2) Date: Mar. 22, 2024

(87) PCT Pub. No.: WO2023/046419
PCT Pub. Date: Mar. 30, 2023

(65) Prior Publication Data
US 2024/0402272 A1      Dec. 5, 2024

Related U.S. Application Data

(60) Provisional application No. 63/247,822, filed on Sep. 24, 2021.

(51) Int. Cl.
*G01R 33/34* (2006.01)
*G01R 33/3415* (2006.01)
*G01R 33/36* (2006.01)

(52) U.S. Cl.
CPC ... *G01R 33/3415* (2013.01); *G01R 33/34007* (2013.01); *G01R 33/34084* (2013.01); *G01R 33/3692* (2013.01)

(58) Field of Classification Search
CPC .......... G01R 33/3415; G01R 33/34007; G01R 33/34084; G01R 33/3692; G01R 33/36
See application file for complete search history.

(56) References Cited

U.S. PATENT DOCUMENTS 4,685,462 A      8/1987  Olsen
4,956,609 A *    9/1990  Miyajima ........ G01R 33/34084
                                                            324/318

(Continued)

FOREIGN PATENT DOCUMENTS

CN            1095959 A      12/1994

OTHER PUBLICATIONS

International Search Report and Written Opinion from PCT/EP2022/073932 mailed Dec. 6, 2022.

*Primary Examiner* — G.M. A Hyder

(57) ABSTRACT

A magnetic resonance (MR) coil construction system includes MR coil sheets (20) comprising electrically conductive MR coil elements or MR coil element portions (22) disposed in electrically insulating sheets (26). The MR coil sheets have edges with connecting mechanisms (34, 48) configured to connect the MR coil sheets to construct an MR coil array (44).

21 Claims, 4 Drawing Sheets

(56) References Cited

U.S. PATENT DOCUMENTS

| | | | | |
|---|---|---|---|---|
| 5,905,378 A | * | 5/1999 | Giaquinto | G01R 33/34084 |
| | | | | 324/318 |
| 2007/0001676 A1 | | 1/2007 | Schilling et al. | |
| 2008/0211498 A1 | * | 9/2008 | Dannels | G01R 33/3415 |
| | | | | 324/309 |
| 2012/0161768 A1 | * | 6/2012 | Hardy | G01R 33/3642 |
| | | | | 324/318 |
| 2015/0301132 A1 | | 10/2015 | Wirtz et al. | |
| 2017/0067973 A1 | * | 3/2017 | Hyun | A61B 5/055 |
| 2018/0017643 A1 | | 1/2018 | Zink | |
| 2018/0269709 A1 | | 9/2018 | White et al. | |
| 2019/0154773 A1 | | 5/2019 | Stack et al. | |
| 2020/0081082 A1 | * | 3/2020 | Kundner | G01R 33/3415 |

* cited by examiner

FLEXIBLE MAGNETIC RESONANCE (MR) COIL ARRAY USING ELECTRICAL ZIPPER CONTACTS

CROSS REFERENCE TO RELATED APPLICATIONS

This application is a U.S. national phase application of International Application No. PCT/EP2022/073932 filed on Aug. 29, 2022, which claims the benefit of U.S. Provisional Application Ser. No. 63/247,822 filed on Sep. 24, 2021 and is incorporated herein by reference.

FIELD

The following relates generally to the magnetic resonance (MR) imaging arts, MR coil array arts, MR coil array assembly arts, MR coil configuration arts, and related arts.

BACKGROUND

MR coil arrays consisting of a plurality of coil elements are increasingly common, as such a coil array can provide parallel imaging data acquisition and consequently faster data acquisition and/or higher image resolution and/or higher SNR (signal to noise ratio). An MR receive coil array with a plurality of coil elements may employ many channels to acquire in parallel, e.g. one channel per coil element.

However, it is difficult to develop a "one-size-fits-all" coil array that is suitably used for patients of different sizes, girths, or other body-specific considerations. As a consequence, an MR imaging laboratory typically needs to stock a set of MR coil arrays for a particular anatomy (e.g., torso coil arrays) for patients of different sizes and body shapes. This is costly. Additionally, if the imaging technician selects a coil array that does not fit the particular patient well then this can degrade the image quality of the acquired MR images.

The following discloses certain improvements.

SUMMARY

In some embodiments disclosed herein, a MR coil construction system includes MR coil sheets comprising electrically conductive MR coil elements or MR coil element portions disposed in electrically insulating sheets. The MR coil sheets have edges with connecting mechanisms configured to connect the MR coil sheets to construct an MR coil array.

In some embodiments disclosed herein, a MR coil array includes MR coil sheets, wherein each MR coil sheet comprises at least one electrically conductive MR coil element or MR coil element portion disposed in an electrically insulating sheet having at least one edge that includes zipper teeth. One or more zippers secure the MR coil sheets together to form the MR coil array in which each zipper is formed by interlocked zipper teeth of neighboring edges of different MR coil sheets of the MR coil array.

In some embodiments disclosed herein, a method of constructing a MR coil array includes connecting MR coil sheets comprising electrically conductive MR coil elements or MR coil element portions together using edge connectors to construct the coil array.

One advantage resides in providing a highly configurable MR coil array.

Another advantage resides in providing a MR coil array in which the metallic conductor loops can be placed close to the patient, improving signal-to-noise ratio (SNR).

Another advantage resides in a MR coil array with zipper assemblies to provide geometrically fixed spatial relationship between coil elements in adjacent sheets.

Another advantage resides in providing an MR coil array with zipper assemblies that provide visually perceptible positive connections between the coil sheets making up the configured MR coil array.

Another advantage resides in enabling detuning of an MR coil array by partially unzipping coil sheets from the coil array.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
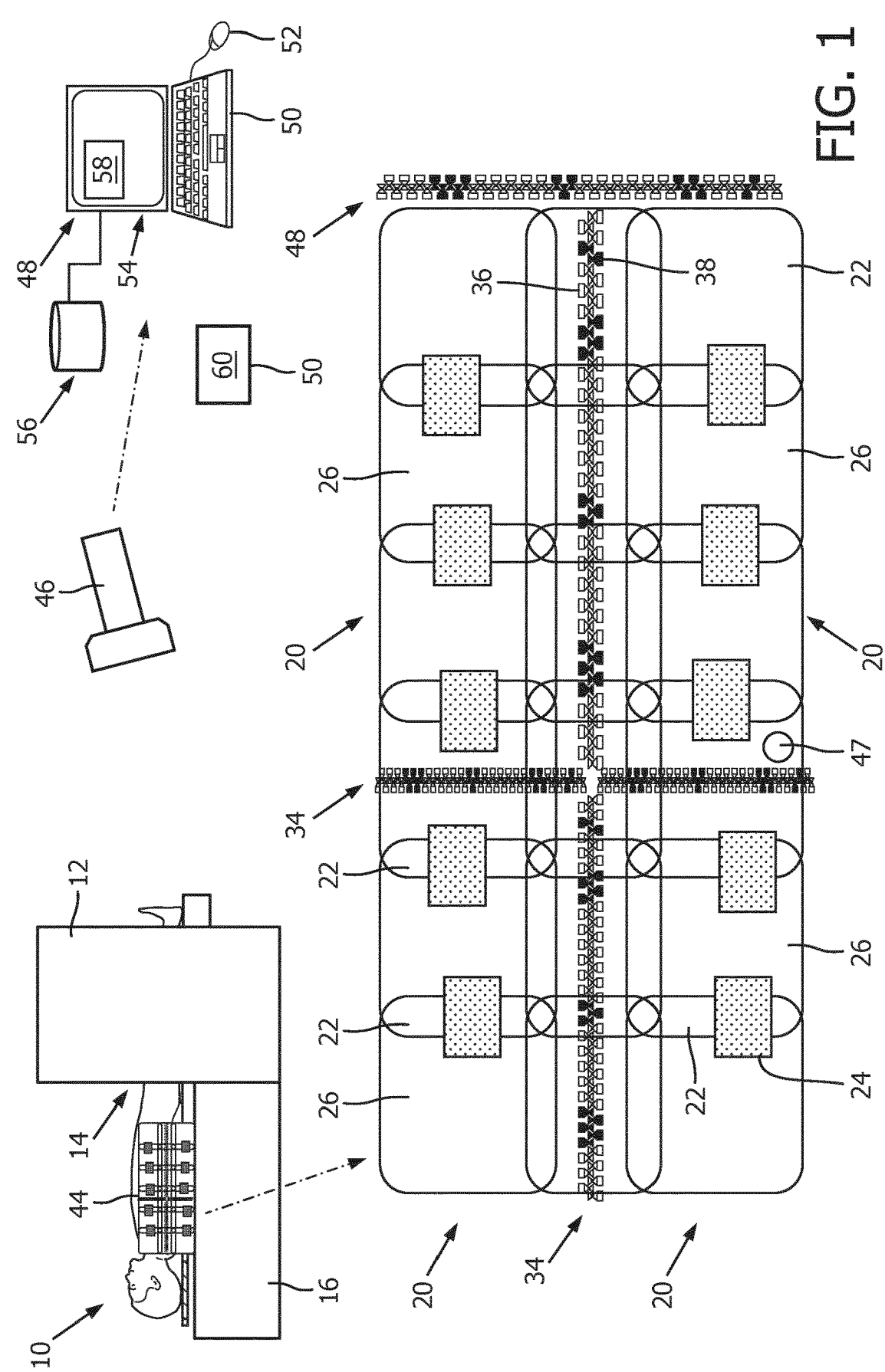
FIG. 1 diagrammatically illustrates a magnetic resonance (MR) imaging device including a MR coil array in accordance with the present disclosure.

The following discloses a flexible coil arrangement, in which flexible coil sheets with zippered edges can be selectively connected to form a coil array of a desired size. To provide galvanic electrical connection between coil elements in adjacent coil sheets, in some examples, the zipper includes mostly electrically nonconducting teeth but also a few electrically conducting teeth to provide the galvanic connections. In other examples, an additional connection link cable may be needed for certain clinical applications to provide the electrical connection between the adjacent coil elements. The coil sheets are contemplated to be made of lightweight foam contained in a plastic jacket, the foam having recesses into which, for example, gold-plated copper coil elements reside. The nonconducting teeth of the zipper can be a hard plastic, while the conducting teeth should be of a non-magnetic material, with a gold-plated copper alloy being currently contemplated. Additionally, it is preferable from a radiofrequency (RF) quality standpoint to have the pre-amplifiers for the RF channels integrated into coil sheets, while in some applications a lower image quality can be tolerable.

In some variant embodiments, the zipper can include a toothless continuous zipper of the type used in applications in which the zipper is desired to make a hermetic seal (e.g., freezer bags for storing frozen foods), or the zipper can be replaced by another edge-to-edge fastener arrangement such as snaps.

If the number of RF channels is sufficient, then the addition of a coil sheet or sheets to (for example) accommodate a patient of larger girth can add more coil elements. On the other hand, if the number of RF channels is limited, then larger coil sheets with larger coil elements can be used to accommodate the larger girth without increasing the number of RF channels used by the coil. As another variant, the choice of coil sheets for use in a particular patient/procedure combination may be made based on coil element density. For example, if it is desired to provide higher resolution imaging on the right side of the body then a coil sheet with higher density of coil elements may be used on the right side versus the left side of the assembled coil array.

In some examples, the zippers can include mutually parallel zippers running along the transverse direction. This allows for size adjustment in only one dimension. However, the zippers can include a two-dimensional array of zippers (where in some cases only one direction will have some conductive teeth).

The resulting MR coil array may be wired or wireless. In one embodiment, the coil fits into a base by way of zipper edges of the outermost coil sheets of the assembled (i.e. "zippered together") coil array. Rather than a base, a connecting zipper could also be integrated into the patient bed. These zippered terminal connections could be galvanic; however, if the on-coil sheet RF processing includes conversion to an optical signal then the zippered terminal connections could be of the form of optical couplers. In another example, the connected coils (e.g., via zippers) may be a local coil disposed on the patient (e.g., an anterior coil on a breast of the patient), and the local coil can be connected via zipper to an interface integrated into the patient table (rather than a mechanical plug). In the case of a wireless MR coil array, the coil sheets (or some subset thereof) suitably include radio or infrared transmitters or transceivers for porting MR signals off the coil array. In this case, the coil array may not need to fit into a base or the like (e.g., the coil array could rest on the patient without any wired signal connection). Furthermore, it is contemplated to integrate sensors (e.g. heart rate, temperature) into the coil sheets, and if this is done then conductive zipper teeth can provide galvanic electrical connections for these sensors. While primarily directed to MR receive coil arrays, the disclosed configurable MR coil arrays employing coil sheets that are zipped together could also be used to construct an MR transmit coil array or an MR transceiver coil array. In this case, the base or other electrical connection suitably includes an RF power input connection to deliver RF power to the MR coil array in the transmit phase of the MR imaging sequence.

The design disclosed herein has significant advantages, most notably a high degree of configurability of the assembled coil. Additionally, the design enables the metallic conductor loops to be placed close to the patient, improving signal-to-noise ratio (SNR). The use of zippers to connect coil sheets to form the MR coil array provides a geometrically fixed spatial relationship between coil elements in adjacent sheets, and the imaging technician can visually verify positive connections between the coil sheets. Yet a further advantage is that detuning of the coil array is possible by, for example, unzipping parts of the coil array to decouple certain coils (though this could also be done electronically, for example by decoupling diodes). Mutually interfering coil elements can be identified during pre-examination RF testing.

In a further aspect, it is contemplated to provide automated or semi-automated assistance to the MR imaging technician in selecting the coil sheets to form the MR coil array. Some MRI scanners include a three-dimensional (3D) camera, and hence the patient can be imaged with the 3D camera during patient loading. Based on that image data and other salient information such as the number of RF channels available and the intended imaging procedure, an artificial intelligence (AI) program can estimate the optimal configuration of coil sheets for that patient, and identifies this configuration to the imaging technician. In one embodiment, it is contemplated to display a graphical rendering of the proposed configured MR coil array including the coil sheets and their zippered connections, which may be useful especially in 2D zipper embodiments with many possible configurations. In a simpler implementation perhaps more suitable for a torso or abdominal coil with only parallel zippers, a torso and/or abdomen measurement could serve as input for the AI program in place of the 3D image.

With reference to FIG. 1, an illustrative magnetic resonance (MR) imaging device 10 comprises a magnetic resonance (MR) imaging scanner, which in the illustrative example includes a housing or gantry 12 containing various components which are not shown in FIG. 1, such as by way of non-limiting illustrative example a superconducting or resistive magnet generating a static ($B_0$) magnetic field, magnetic field gradient coils for superimposing magnetic field gradients on the $B_0$ magnetic field, a whole-body radio frequency (RF) coil for applying RF pulses to excite and/or spatially encode magnetic resonance in an imaging subject disposed in an MR bore 14 or other MR examination region, and/or so forth. A robotic patient couch 16 or other subject support enables loading a medical patient, a subject undergoing a medical screening, or other imaging subject into the MR bore 14 for imaging. The MR imaging employs an MR coil array 44 as further described.

With continuing reference to FIG. 1, the illustrative MR coil array 44 is made up of four coil sheets 20 that have their edges zipped together. Each MR coil sheet 20 forms a portion of the MR coil array 44. Although an MR coil array 44 made of four MR coil sheets 20 is shown in FIG. 1, any suitable number of MR coil sheets may be similarly combined by zippered edges to form a configurable MR coil array having a chosen number of coil elements 22. FIG. 1, lower portion, shows a plan view of the MR coil array 44 made up of the illustrative four coil sheets 20. Each MR coil sheet 20 includes one or more coil elements and/or portion(s) of coil elements 22 (21 of which are shown in FIG. 1) tuned to receive an MR signal, and electronic modules 24 (shown diagrammatically as filled-in boxes) are operatively connected to receive, preamplify, and optionally further process (e.g., digitize) the MR signals received by the coil elements 22. FIG. 1 shows that the MR coil array 44 includes 15 coil elements 22 in a 3×5 array; however, it will be appreciated that this arrangement is merely an illustrative example and that more or fewer than 15 coil elements may be used in various arrangements, e.g. by way of a few further non-limiting illustrative examples the wireless MR coil may include a one-dimensional arrangement (i.e. linear array) of 4 or more coil elements; or may include a two-dimensional arrangement of N·M coil elements arranged in a regular N×M array (in the illustrative case of wireless MR coil 20, N=3 and M=5 so that N·M=15); or may include a two-dimensional arrangement of coil elements that are not arranged in a regular N×M array.

Each coil sheet 20 includes its own insulating sheet 26, which when the coil sheets are zipped together forms the structural support for the MR coil array 44. In some examples, the electrically insulating sheets 26 comprise a lightweight foam contained in a plastic jacket. It is to be understood that the MR coil array 44 with efficient and configurable communication connectivity as disclosed herein can be constructed with a wide range of suitable physical layouts or arrangements. In general the MR coil array 44 can be constructed with any suitable form for a chosen type of imaging, e.g. the illustrative MR coil has the shape of a sheet and may, for example, be disposed on, in, or beneath a pallet (not shown) disposed on the subject couch 16 so as to be arranged to perform imaging of the spine, torso, or the like. Alternatively, the wireless MR coil could be shaped to surround a head (i.e., a head coil), to go around a limb (a limb coil), or so forth.

FIG. 1 also shows that edges of the MR coil sheets 20 include a connecting mechanism configured to connect with corresponding connecting mechanisms 34 of other MR coil sheets 20. In one example embodiment, the connecting mechanisms 34 comprise continuous edge connectors configured to connect the MR coil sheets 20 by interlocking to define toothless zippers.

In the example illustrated in FIG. 1, the connecting mechanisms 34 comprise zipper teeth configured to connect the MR coil sheets 20 by interlocking to define zippers connecting the MR coil sheets 20 together to form the MR coil array 44. The zipper teeth include electrically non-conducting, that is, electrically insulating, zipper teeth (diagrammatically shown in FIG. 1 as unfilled zipper teeth) and electrically conducting, zipper teeth 38 (diagrammatically shown in FIG. 1 as filled zipper teeth). In one example embodiment, the electrically non-conducting teeth 36 are made from plastic and the electrically conducting teeth 38 are made from a gold-plated copper alloy.

The zippers 34 are used to connect multiple coil sheets 20 (four of which are shown in FIG. 1). Once connected, the coil sheets 20 form the MR coil array 44. Stated another way, the coil sheets 20 comprise an MR coil construction system. In some examples, the connecting mechanisms 34 are mutually parallel extending in a transverse direction in the MR coil array 44. In other examples, the connecting mechanisms 34 form an array of connecting mechanisms distributed across a surface of the MR coil array 44 (i.e., two zippers 34 are either mutually perpendicular or mutually parallel). In other examples, once the MR coil array 44 is formed, the coil sheets 20 of the array can include zippers 34 comprising a coil edge attachment 48 comprising edges of MR coil sheets at a periphery of the coil array having zipper teeth 36, 38 not interlocked with zipper teeth of any other coil sheet, thereby allowing the array 44 to be connected with a different coil array (not shown). The MR coil sheets 20 include electrically conductive MR coil element portions configured to be galvanically connected together by the electrically conducting zipper teeth 38. This allows for the coil array 44 to include overlapping coil elements in which some coil elements extend across a zipper 34.

Figure 2:
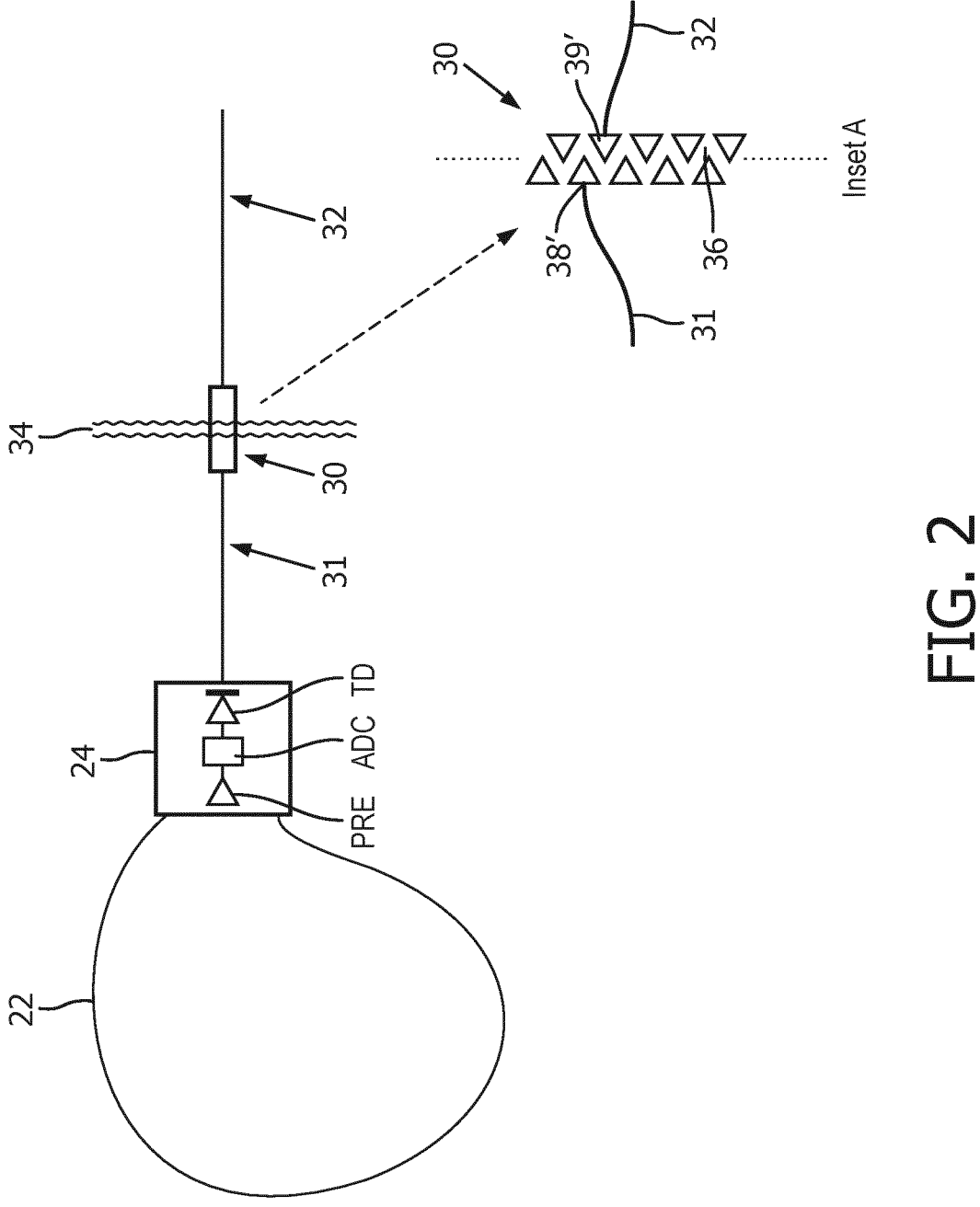
FIG. 2 diagrammatically illustrates a component of the MR coil array in accordance with an embodiment employing optical fibers for porting MR signals off the MR coil array.

With reference to FIG. 2, in some embodiments the electronic modules 24 include electrooptic transducers 28 (e.g., LEDs, which are not shown) that convert the received MR signal to an optical signal. For example, the MR signal from the coil element 22 is received at the electronic module 24 which includes a preamplifier PRE that preamplifies the MR signal, an analog-to-digital converter ADC that digitizes the preamplified MR signal, and an optical transducer TD such as an LED to convert the digitized MR signal to optical pulses. In another example, the electronic module 24 can include a suitable digital connection (e.g., LVDS, FDP 3 link, and so forth), or a suitable an analog connection. The electronic module 24 is connected with an optical fiber 31 that carries the optical pulses. In this case, the optical fiber 31 is to connect with a second optical fiber 32 in another coil sheet. To this end, the connecting zipper includes an optical coupling 30, which can comprise an optical coupling formed by interlocked optical coupler zipper teeth 38', 39' interspersed with optically inactive zipper teeth 36 of the zipper 34 of the MR coil array 44 (see Inset A of FIG. 2). As shown in FIG. 2, the optical fiber 31 connects with an optical fiber 32 across the zipper 34 by way of a first zipper tooth 38' connected to the launching optical fiber 31 which serves to launch the optical signal, and a second zipper tooth 39' of a different coil sheet that is connected with the optical fiber 32 and receives the optical signal launched by the zipper tooth 38'. The zipper teeth 38', 39' are pressed together by the zipping process, providing a physical adjacency to facilitate transfer of the light from the zipper tooth 38' to the zipper tooth 39'.

Referring back to FIG. 1, it is contemplated to provide a way to automatically recommend a particular coil array configuration for a particular patient. To this end, one or more sensors are provided, which are configured to measure a patient characteristic of a patient. In one example embodiment, the sensor comprises a camera 46 (e.g., a three-dimensional (3D) camera) configured to acquire images of a patient during patient loading into the bore 14 of the MR imaging device 12.

In another example, the sensor can include one or more sensors 47 disposed on the coil array 44 adjacent the zipper 34 to determine whether the zipper 34 is correctly used. In some examples, each zipper 34 can include a corresponding sensor 47 (although only one sensor 47 is shown in FIG. 1). The zipper 34 needs to be closed completely (i.e., from beginning to end) such that the zipper teeth 36, 38 (or the zipper teeth 38', 39') are all engaged with each other. If the zipper 34 is not completely closed, the sensor 47 can generated a feedback signal (i.e., an optical signal, an acoustic signal, or so forth) to the medical professional assembling the coil array 44. In addition, the sensor 47 can generate the feedback signal if the zipper 34 comes undone by itself during an imaging examination (e.g., opening due to body motion by the patient on which the coil array 44 is placed, the coil array being pinched between the subject couch 16 and the patient and/or the gantry 12, and so forth).

FIG. 1 also shows an electronic processing device 48, which comprises a tablet, a laptop computer, a workstation computer, or more generally a computer. The electronic processing device 48 includes typical components, such as an electronic processor 50 (e.g., a microprocessor), at least one user input device (e.g., a mouse, a keyboard, a trackball, a touch screen, and/or the like) 52, and at least one display device 54 (e.g. an LCD display, plasma display, cathode ray tube display, and/or so forth). The electronic processor 50 is operatively connected with a one or more non-transitory storage media 56. The non-transitory storage media 56 may, by way of non-limiting illustrative example, include one or more of a magnetic disk, RAID, or other magnetic storage medium; a solid state drive, flash drive, electronically erasable read-only memory (EEROM) or other electronic memory; an optical disk or other optical storage; various combinations thereof; or so forth; and may be for example a network storage, an internal hard drive of the electronic processing device 48, various combinations thereof, or so forth. It is to be understood that any reference to a non-transitory medium or media 56 herein is to be broadly construed as encompassing a single medium or multiple media of the same or different types. Likewise, the electronic processor 50 may be embodied as a single electronic processor or as two or more electronic processors. The non-transitory storage media 56 stores instructions executable by the at least one electronic processor 50. The instructions include instructions to generate a graphical user interface (GUI) 58 for display on the service device display device 54. In addition, the electronic processor 50 employs an artificial intelligence (AI) component 60 configured to output a recommended configuration of the MR coil array 40 based on a measured patient characteristic (e.g., measured by the camera 46) by estimating the recommended configuration of the MR coil array 44 for the patient.

Figure 3:
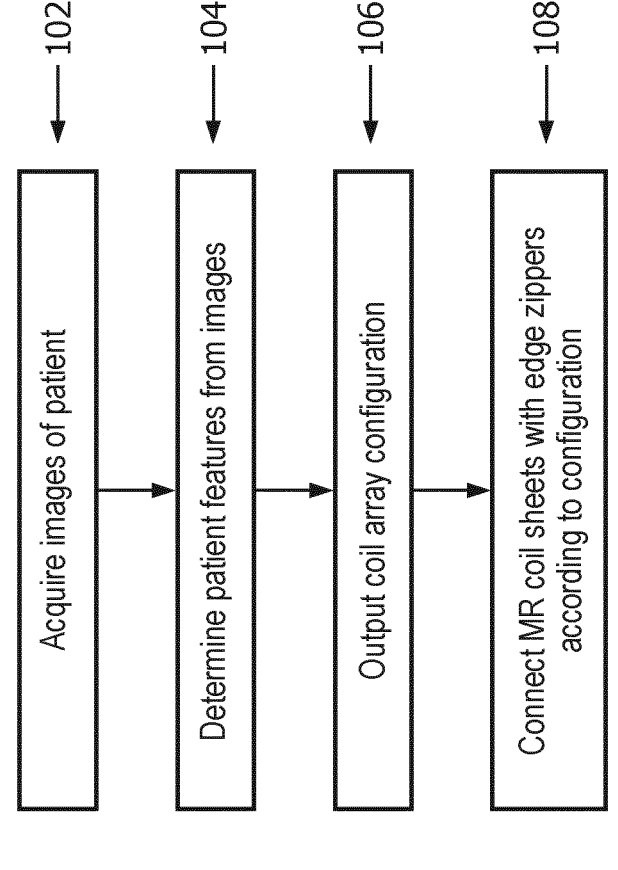
FIG. 3 diagrammatically illustrates a construction method of the coil array of FIG. 1.
Figure 3:
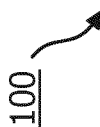

With reference to FIG. 3, an illustrative operation of construction of the MR coil array 44 is diagrammatically shown as a flowchart. At an operation 102, the camera 46 is configured to acquire 3D images of the patient being loaded into the bore 14 of the MR imaging device 12. At an operation 104, performed by the electronic processing device 48, the electronic processor 50 is configured to processes the 3D images of the patient to determine one or more patient features (e.g., height, weight, girth, and so forth) by image processing performed on the 3D image. At an operation 106, performed by the electronic processing device 48, the determined features are input to the AI component 60, and the AI component outputs a proposed MR coil array configuration based on the determined features. The configuration includes a grid of coil sheets 20. The proposed MR coil array configuration can be displayed on the GUI 58 of the display device 54.

At a manual operation 108 (that is, not performed by the electronic processing device 48), MR coil sheets 20 comprising the electrically conductive MR coil elements or MR coil element portions 22 are connected using the edge connecting mechanisms 48 to construct the MR coil array 44 according to the configuration output by the AI component 60 and displayed on the display device 54. The edge connecting mechanisms 48 comprise electrically non-conducting zipper teeth 36 and electrically conducting zipper teeth 38. The MR coil sheets 20 include electrically conductive MR coil element portions configured to be galvanically connected together by the electrically conducting zipper teeth.

In another, more manual, embodiment, the operation 102 may be omitted, the operation 104 may comprise a manual acquisition of patient features such as manual measurement using a tape measure of the torso and/or waist circumference, and the operation 106 determines the recommended coil array configuration based on the measurements acquired at the operation 104. Here, the operation 106 may be performed by the electronic processing device 48, e.g. after receiving typed inputs of the torso and/or waist measurements, or may be done manually using a printed table listing recommended coil array configurations for different waist and/or torso measurements.

A typical coil element includes first and second parts. The first part contains electronics such as preamplifiers and detune electronics. This first part can be connected to the MR system via a cable (e.g., optical, galvanic or both), or the connection can be wireless. This coil part is stand-alone and is connected to a second part of the coil element. The second part of the coil element contains only radiofrequency (RF) coil elements. The second part of the coil can be disposable or exchanged in case of failure. The second part is relatively cheap and need service or be exchanged after a certain number of uses. The first part is much more expensive and can be connected to different coil parts. The first part can identify the second part via a circuit, which is connected via a zipper.

Figure 4:
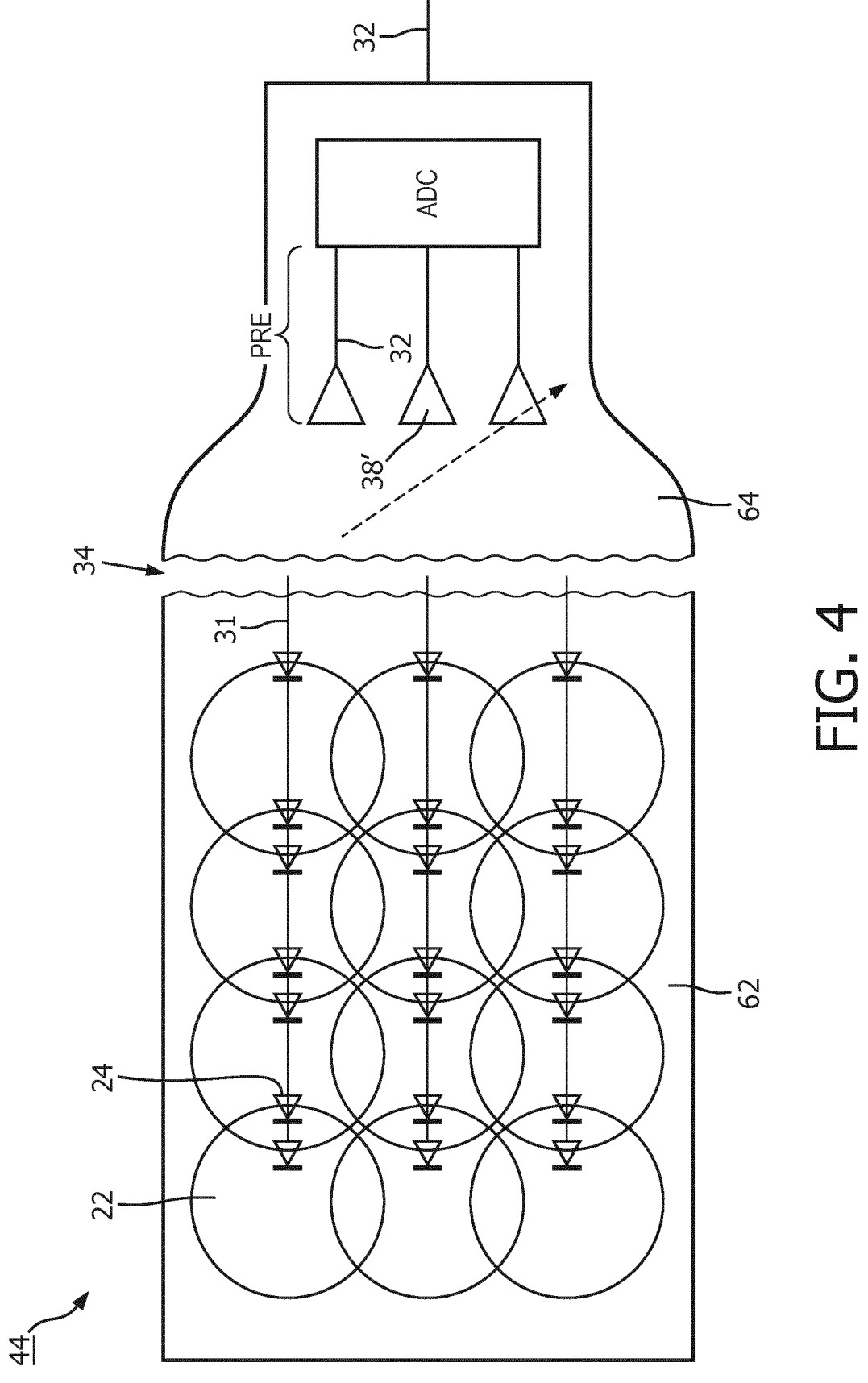
FIG. 4 diagrammatically illustrates an embodiment of the MR coil array of FIG. 1.

Referring now to FIG. 4, another example of the coil array 44 is shown. As shown in FIG. 4, the coil array 44 includes the coil element portions 22, the electronic modules 24, and multiple launching optical fibers 31 connected to the electronic modules disposed on a first part 62 of the coil array 44. A second part 64 of the coil array 64 includes multiple preamplifiers PRE (in communication with the multiple launching optical fibers 31), the analog-to-digital converter ADC, and a single optical fiber 32 connected to the analog-to-digital converter ADC. A zipper 34, such as the one described in reference to FIG. 2, connects the first part 62 and the second part 64 to form an optical coupling between the first and second parts.

The disclosure has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. A magnetic resonance (MR) coil construction system, comprising:
   MR coil sheets comprising electrically conductive MR coil elements or MR coil element portions disposed in electrically insulating sheets;
   wherein the MR coil sheets have edges with connecting mechanisms configured to connect the MR coil sheets to construct an MR coil array,
   wherein the connecting mechanisms comprise zipper teeth.

2. The MR coil construction system of claim 1, wherein the zipper teeth are configured to connect the MR coil sheets by interlocking to define zippers connecting the MR coil sheets.

3. The MR coil construction system of claim 1, wherein the zipper teeth comprises electrically non-conducting zipper teeth and electrically conducting zipper teeth, and the MR coil sheets include electrically conductive MR coil element portions configured to be galvanically connected together by the electrically conducting zipper teeth.

4. The MR coil construction system of claim 3, wherein the electrically non-conducting teeth are made from plastic and the electrically conducting teeth are made from a gold-plated copper alloy.

5. The MR coil construction system of claim 1, wherein the electrically insulating sheets comprise a lightweight foam contained in a plastic jacket.

6. An MR coil array constructed using the MR coil array construction system of claim 1.

7. The MR coil array of claim 6, wherein the connecting mechanisms are mutually parallel extending in a transverse direction in the MR coil array.

8. The MR coil array of claim 6, wherein the connecting mechanisms form an array of connecting mechanisms distributed across a surface of the MR coil array.

9. A magnetic resonance (MR) coil construction system, comprising:
   MR coil sheets comprising electrically conductive MR coil elements or MR coil element portions disposed in electrically insulating sheets;
   wherein the MR coil sheets have edges with connecting mechanisms configured to connect the MR coil sheets to construct an MR coil array,
   one or more sensors configured to measure a patient characteristic of a patient; and at least one electronic processor programmed to output a recommended configuration of the MR coil array based on the measured patient characteristic.

10. The MR coil construction system of claim 9, wherein:

the one or more sensors comprises a camera configured to acquire images of a patient during patient loading into a bore of an MR imaging device; and the at least one electronic processor is programmed to estimate the recommended configuration of the MR coil array for the patient.

11. The system of claim 9, wherein the connecting mechanisms comprise zipper teeth configured to connect the MR coil sheets by interlocking to define zippers connecting the MR coil sheets.

12. The system of claim 9, wherein the connecting mechanisms comprise continuous edge connectors configured to connect the MR coil sheets by interlocking to define toothless zippers.

13. A magnetic resonance (MR) coil construction system, comprising:

MR coil sheets comprising electrically conductive MR coil elements or MR coil element portions disposed in electrically insulating sheets;

wherein the MR coil sheets have edges with connecting mechanisms configured to connect the MR coil sheets to construct an MR coil array, a first part including at least the electrically conductive MR coil element portions;

a second part including at least preamplifiers; and a zipper configured to connect the first part and the second part and electrically connect the preamplifiers to the electrically conductive MR coil portions.

14. A magnetic resonance (MR) coil array comprising:

MR coil sheets, wherein each MR coil sheet comprises at least one electrically conductive MR coil element or MR coil element portion disposed in an electrically insulating sheet having at least one edge that includes zipper teeth; and one or more zippers securing the MR coil sheets together to form the MR coil array, each zipper being formed by interlocked zipper teeth of neighboring edges of different MR coil sheets of the MR coil array.

15. The MR coil array of claim 14, wherein the zipper teeth of the MR coil sheets include:

electrically insulating zipper teeth; and electrically conductive zipper teeth;

wherein the MR coil array includes at least one zipper-connected MR coil element that is formed by MR coil element portions of two MR coil sheets that are galvanically connected in the MR coil array by interlocked electrically conductive zipper teeth of the zipper that secures the two MR coil sheets together.

16. The MR coil array of claim 14, wherein the zipper teeth of the MR coil sheets include:

optically inactive zipper teeth; and optical coupler zipper teeth;

wherein the MR coil array includes at least one optical fiber connection comprising an optical coupling formed by interlocked optical coupler zipper teeth of at least one zipper of the MR coil array.

17. The MR coil array of claim 14, further comprising:

a coil edge attachment comprising edges of MR coil sheets at a periphery of the coil array having zipper teeth not interlocked with zipper teeth of any other coil sheet.

18. The MR coil array of claim 14, wherein each two zippers of the MR coil array are either mutually perpendicular or mutually parallel.

19. The MR coil array of claim 14, wherein the coil sheets further include preamplifiers electrically connected with the electrically conductive MR coil elements or MR coil element portions.

20. A method of constructing a magnetic resonance (MR) coil array, the method comprising:

connecting MR coil sheets comprising electrically conductive MR coil elements or MR coil element portions together using edge connectors to construct the coil array, wherein the edge connectors comprise zipper teeth configured to connect the MR coil sheets by interlocking to define zippers connecting the MR coil sheets.

21. The method of claim 20, wherein method further includes:

acquiring images of a patient being loaded into a bore of the medical imaging device);

determining one or more features of the patient from the acquired images; and outputting a proposed configuration of the MR coil array configuration including a grid of coil sheets;

wherein the MR coil array is assembled according to the proposed configuration.

\* \* \* \* \*